(12) United States Patent
Taylor

(10) Patent No.: US 6,347,346 B1
(45) Date of Patent: Feb. 12, 2002

(54) LOCAL MEMORY UNIT SYSTEM WITH GLOBAL ACCESS FOR USE ON RECONFIGURABLE CHIPS

(75) Inventor: Bradley L. Taylor, Oakland, CA (US)

(73) Assignee: Chameleon Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/343,477

(22) Filed: Jun. 30, 1999

(51) Int. Cl.[7] .............................................. G06F 13/28
(52) U.S. Cl. ............................ 710/23; 710/22; 710/129
(58) Field of Search ............................... 326/38, 40, 41; 710/22, 23, 52, 129; 711/170; 364/521; 365/189.01, 63, 230.03, 189.08, 230.06

(56) References Cited

U.S. PATENT DOCUMENTS

| | | | |
|---|---|---|---|
| 4,122,531 A | * 10/1978 | Tamaru et al. | 365/230.03 |
| 4,507,730 A | * 3/1985 | Johnson et al. | 711/170 |
| 4,823,286 A | * 4/1989 | Lumelsky et al. | 364/521 |
| 5,025,421 A | * 6/1991 | Cho | 365/230.05 |
| 5,210,749 A | 5/1993 | Firoozmand | |
| 5,261,077 A | * 11/1993 | Duval et al. | 710/129 |
| 5,295,098 A | 3/1994 | Kohno | |
| 5,298,805 A | * 3/1994 | Garverick et al. | 326/37 |
| 5,392,292 A | * 2/1995 | Davis et al. | 714/7 |
| 5,422,856 A | 6/1995 | Sasaki et al. | |
| 5,560,030 A | 9/1996 | Guttag et al. | |
| 5,692,147 A | * 11/1997 | Larsen et al. | 711/202 |
| 5,703,826 A | 12/1997 | Hush et al. | |
| 5,760,607 A | 6/1998 | Leeds, et al. | |
| 5,793,992 A | * 8/1998 | Steele et al. | 710/113 |
| 5,802,554 A | * 9/1998 | Caceres et al. | 711/103 |
| 5,822,618 A | 10/1998 | Ecclesine | |
| 5,835,927 A | 11/1998 | Fandrich et al. | |
| 5,949,719 A | * 9/1999 | Clinton et al. | 365/189.01 |
| 6,011,407 A | * 1/2000 | New | 326/39 |
| 6,023,421 A | * 2/2000 | Clinton et al. | 365/63 |
| 6,034,538 A | * 3/2000 | Abramovici | 326/38 |
| 6,038,192 A | * 3/2000 | Clinton et al. | 365/230.03 |
| 6,044,416 A | * 3/2000 | Hasan | 710/52 |
| 6,049,487 A | * 4/2000 | Plants et al. | 365/189.04 |
| 6,058,063 A | 5/2000 | Jang | |
| 6,075,745 A | * 6/2000 | Gould et al. | 365/230.03 |
| 6,088,795 A | * 7/2000 | Vorbach et al. | 713/100 |
| 6,118,707 A | * 9/2000 | Gould et al. | |
| 6,130,854 A | * 10/2000 | Gould et al. | 365/230.06 |

\* cited by examiner

*Primary Examiner*—Thomas Lee
*Assistant Examiner*—Thuan Du
(74) *Attorney, Agent, or Firm*—Burns Doane Swecker & Mathis LLP

(57) ABSTRACT

A memory access system is described in which local memory units on a reconfigurable chip can be used in conjunction with the system memory. Data path units on the reconfigurable chip can cause data to be swapped in and out of the local memory units as a result of calculations within the reconfigurable fabric. Alternately, a cache-like system can be used so that the data can be read into the local memory unit from the system memory units automatically.

44 Claims, 13 Drawing Sheets

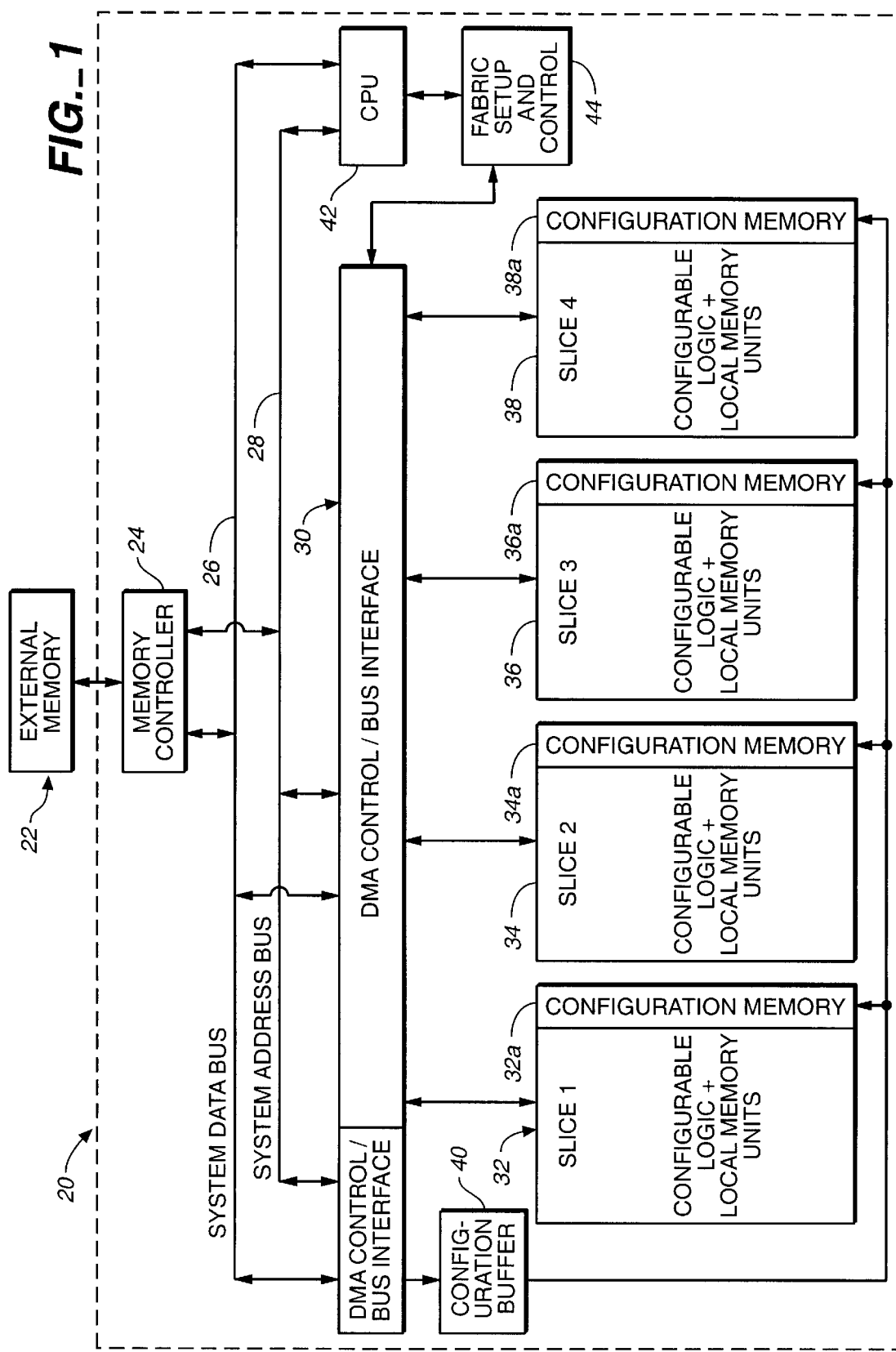
FIG._1

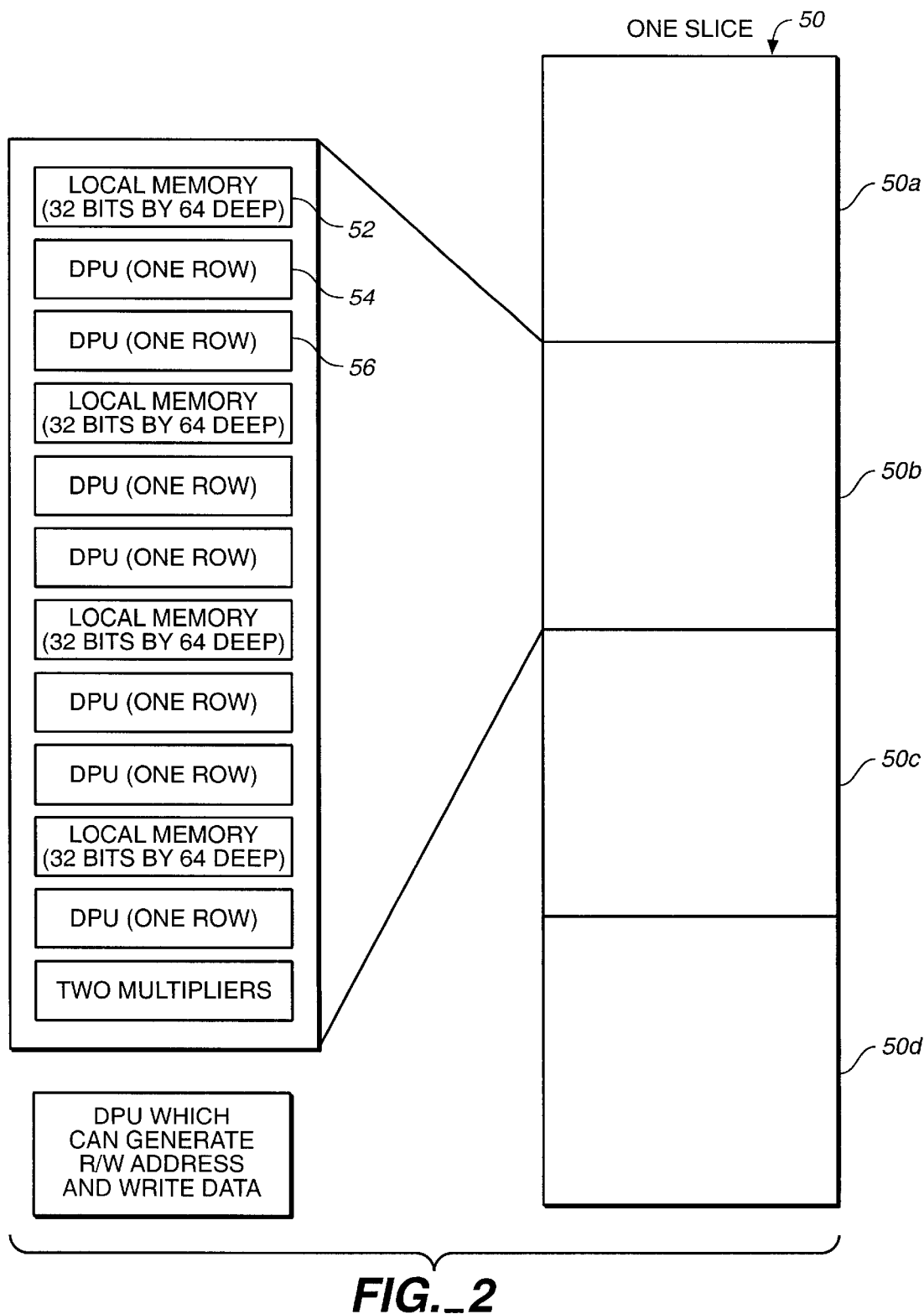
FIG._2

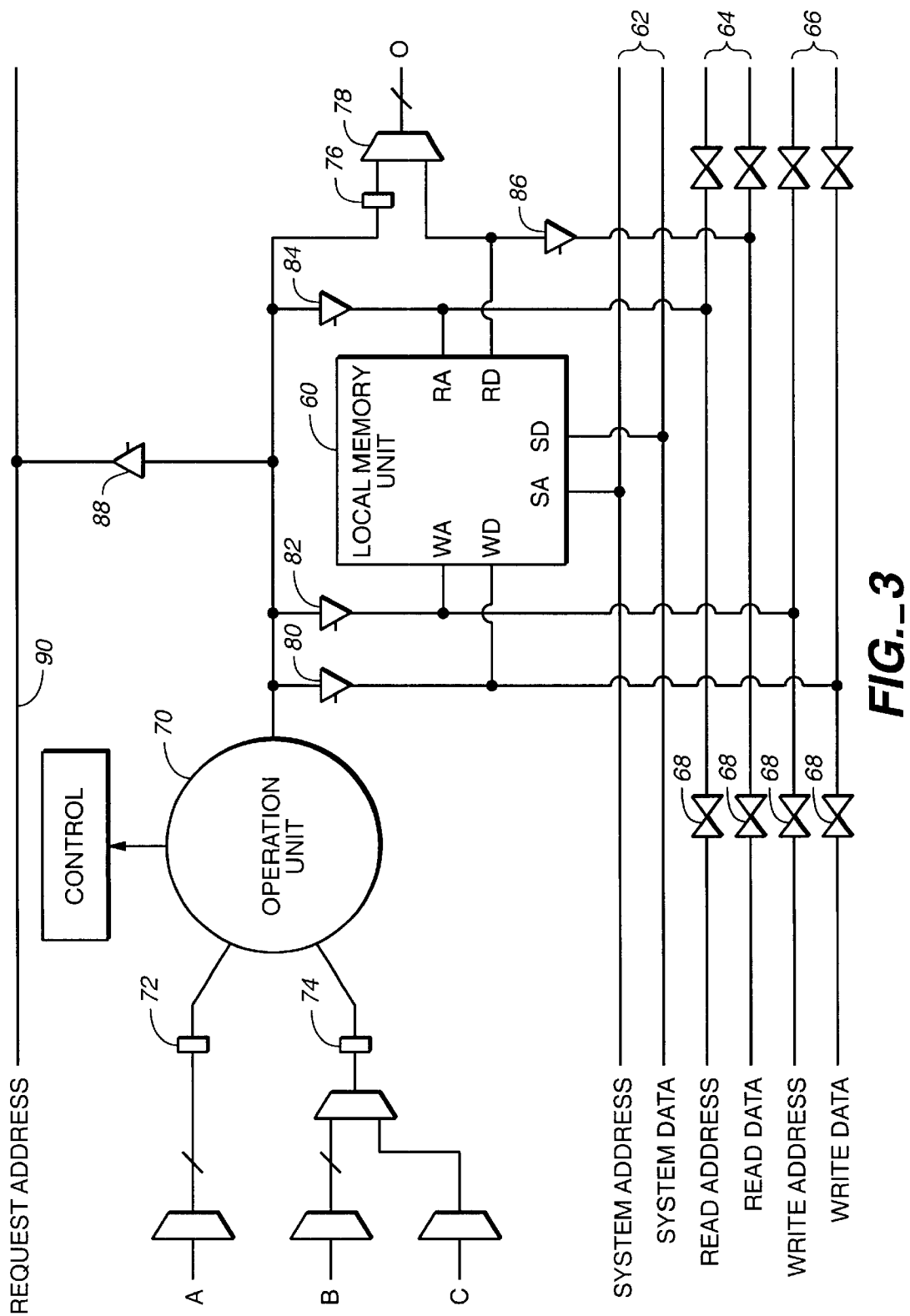
FIG._3

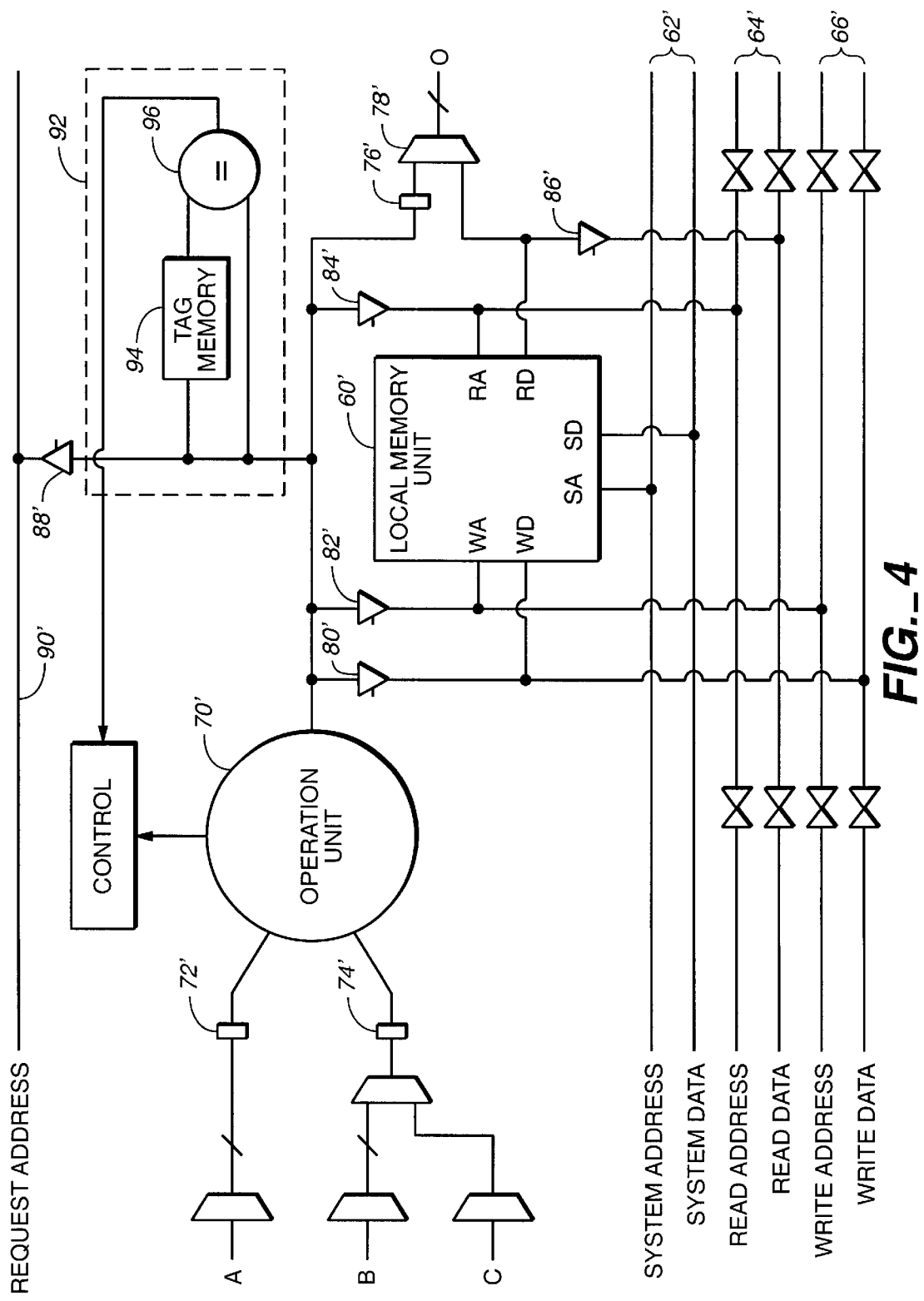
FIG._4

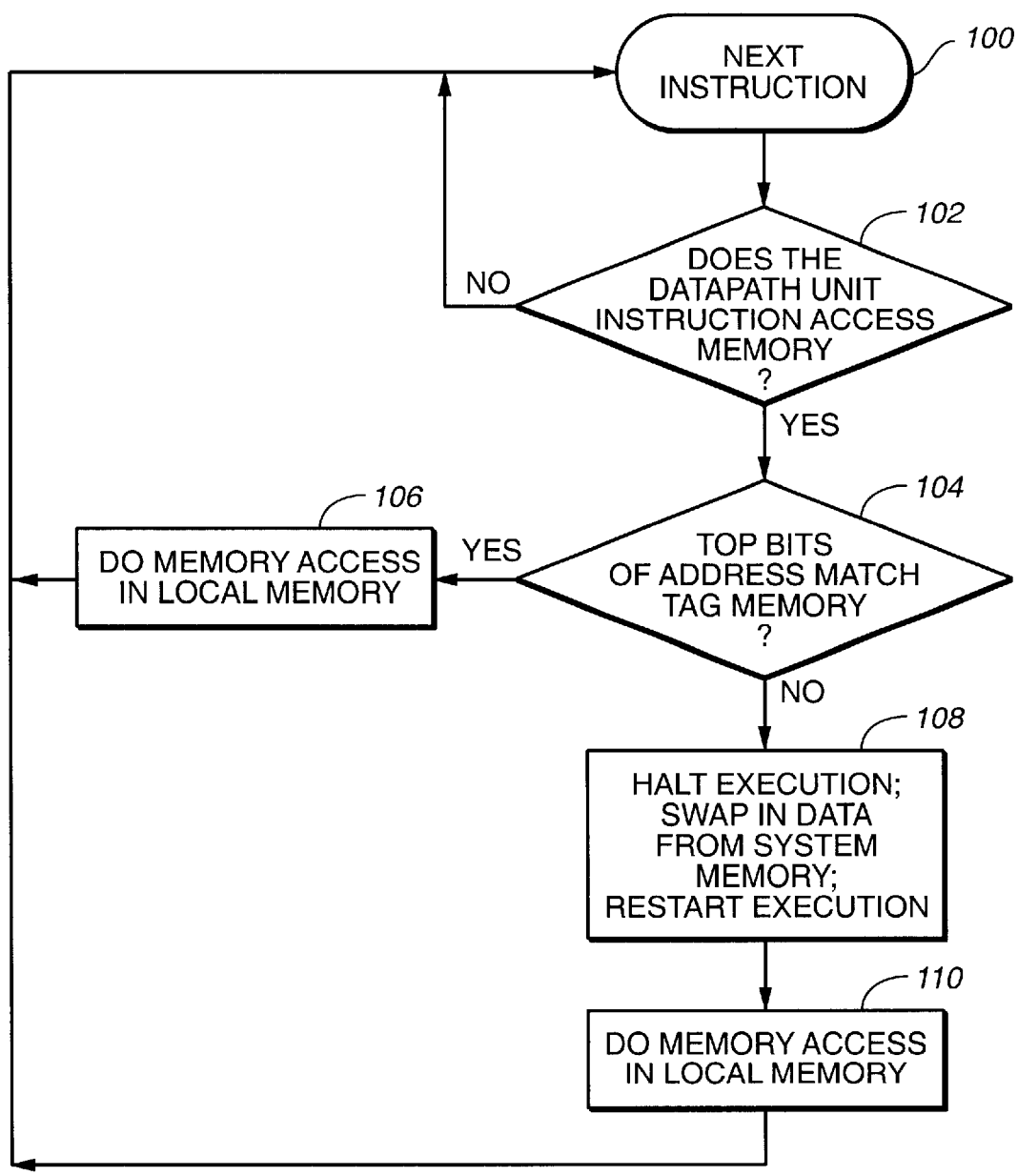
FIG._5

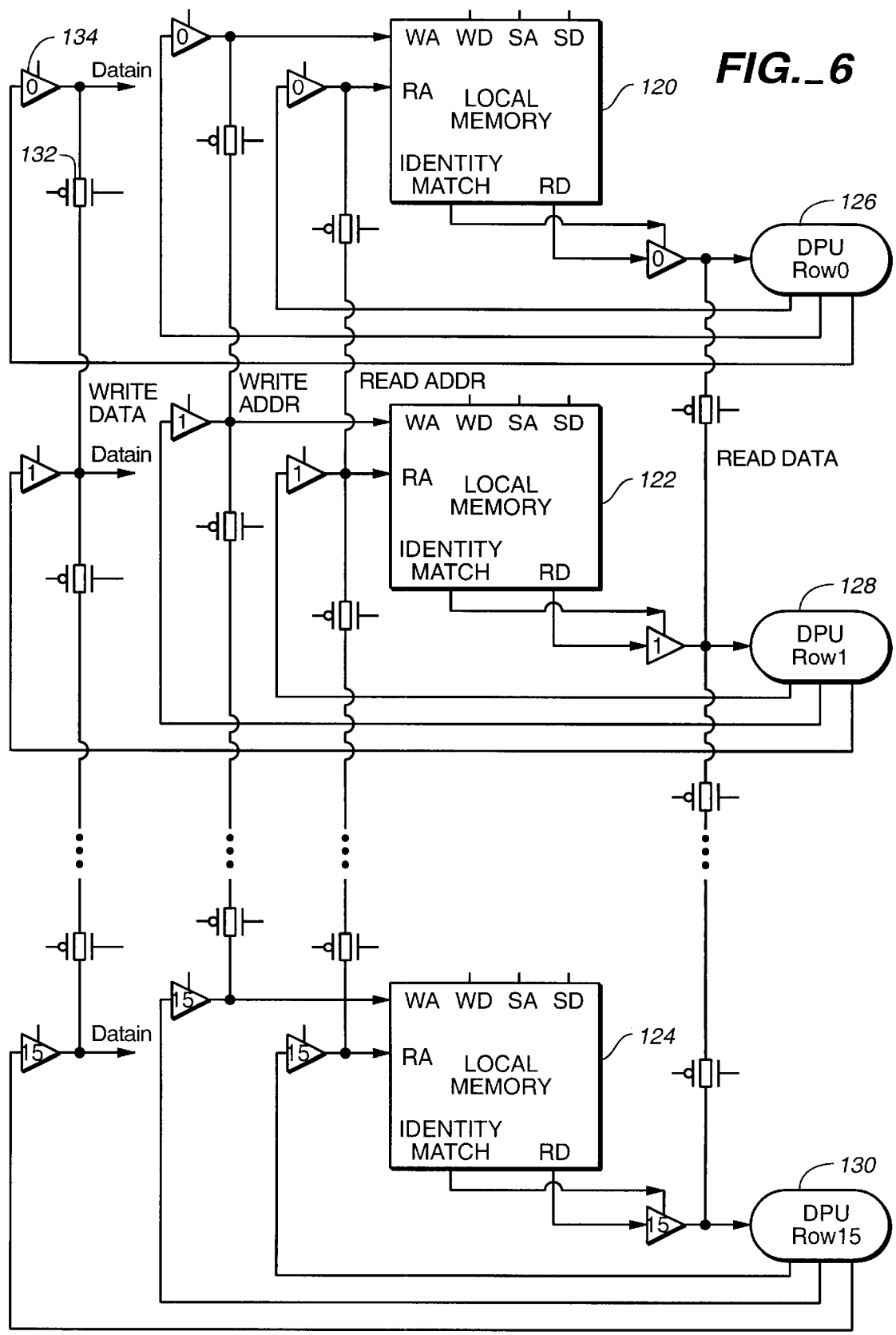
FIG._6

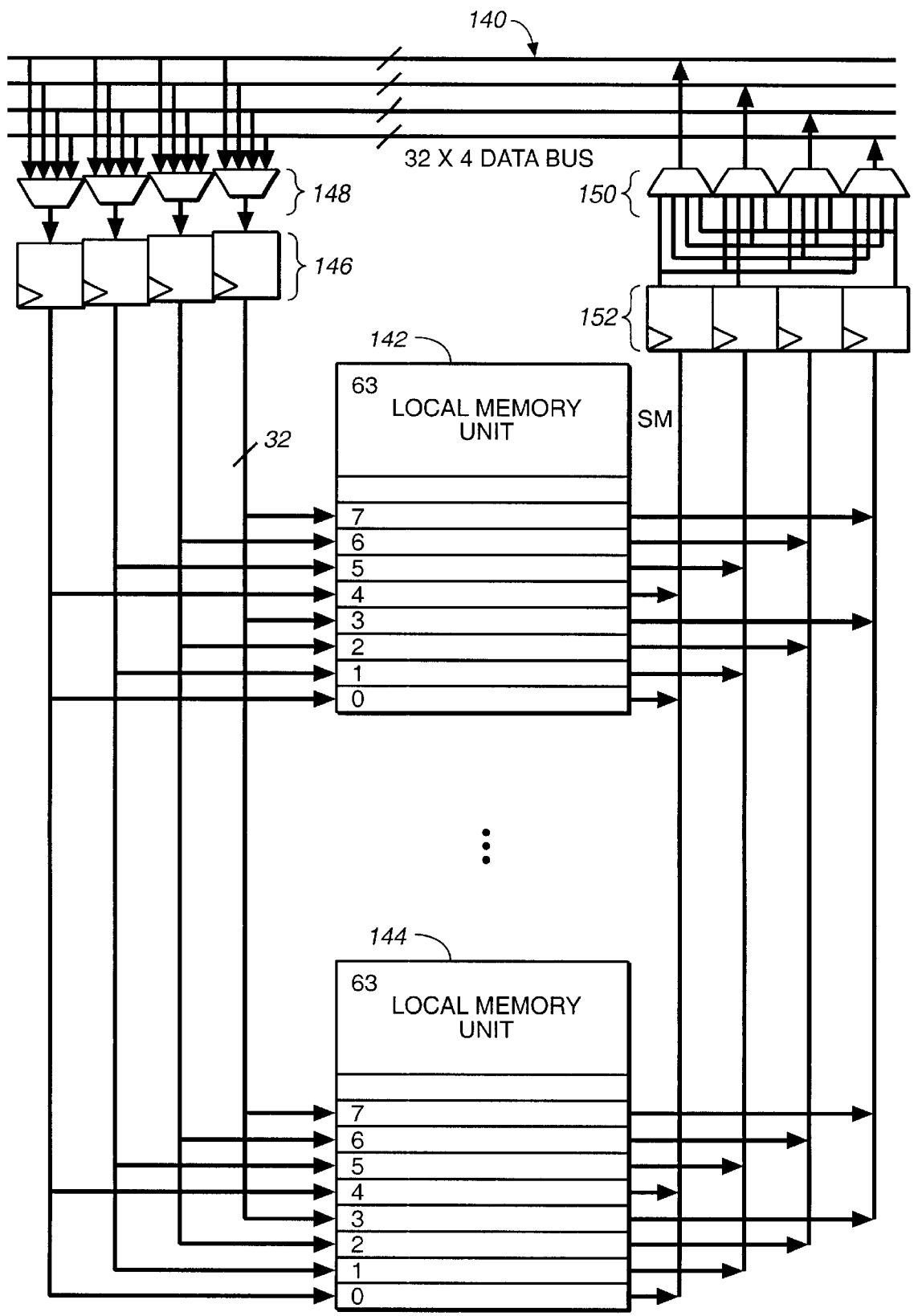
FIG._7

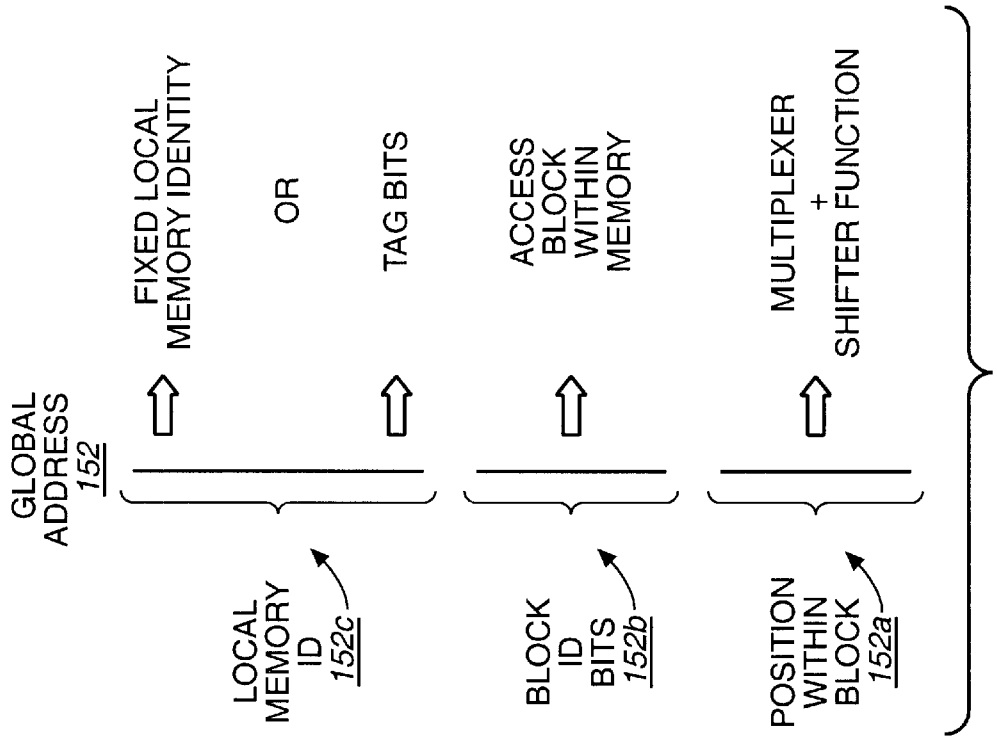
*FIG._8B*
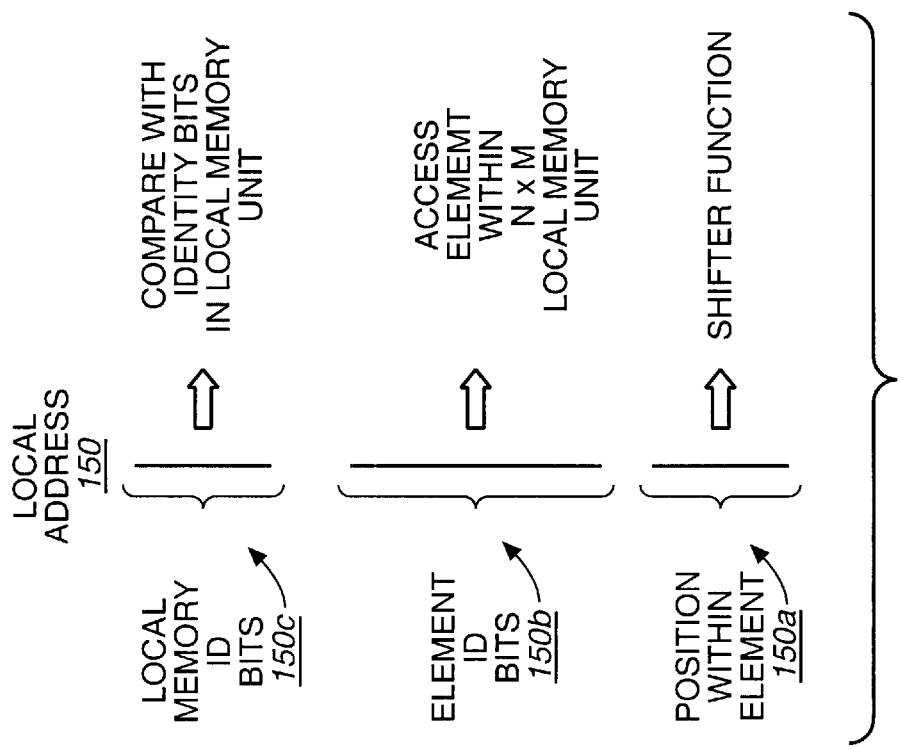
*FIG._8A*

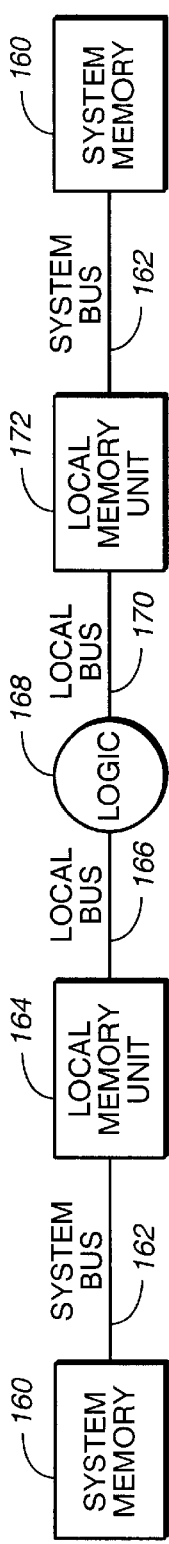
FIG._9
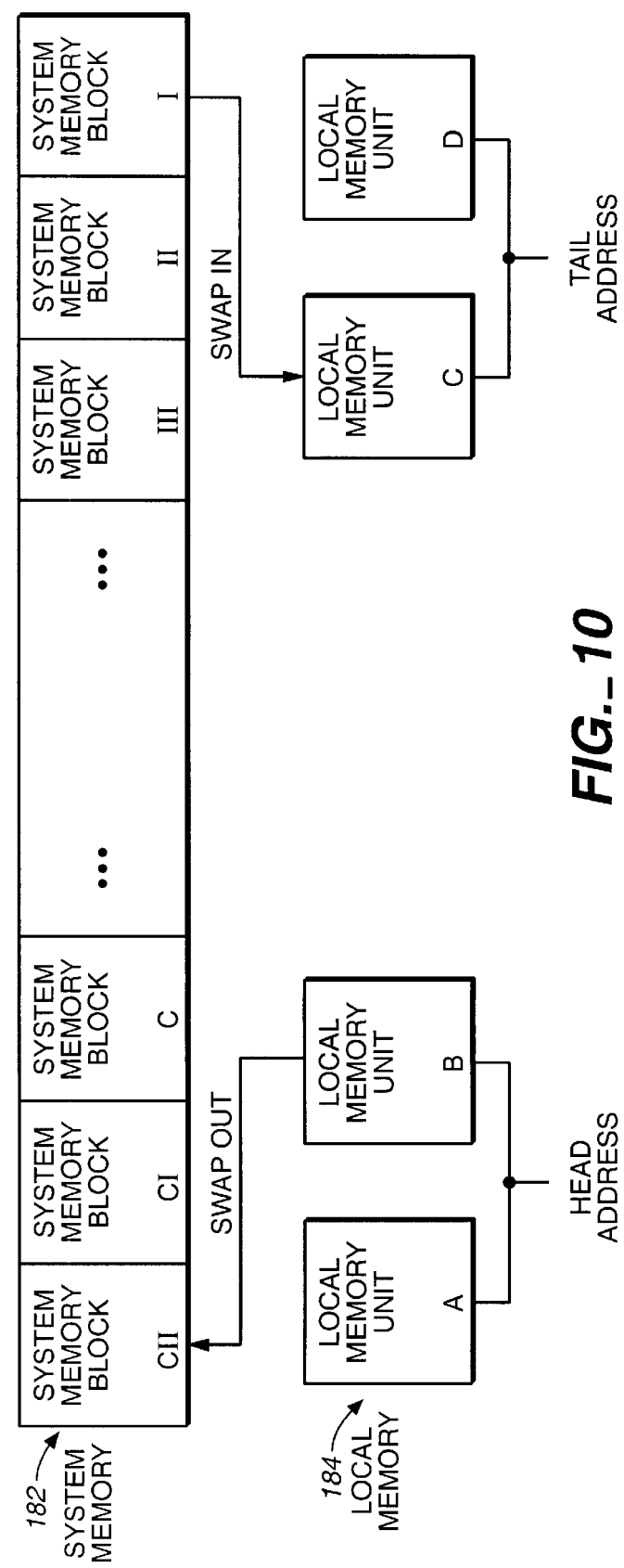
FIG._10

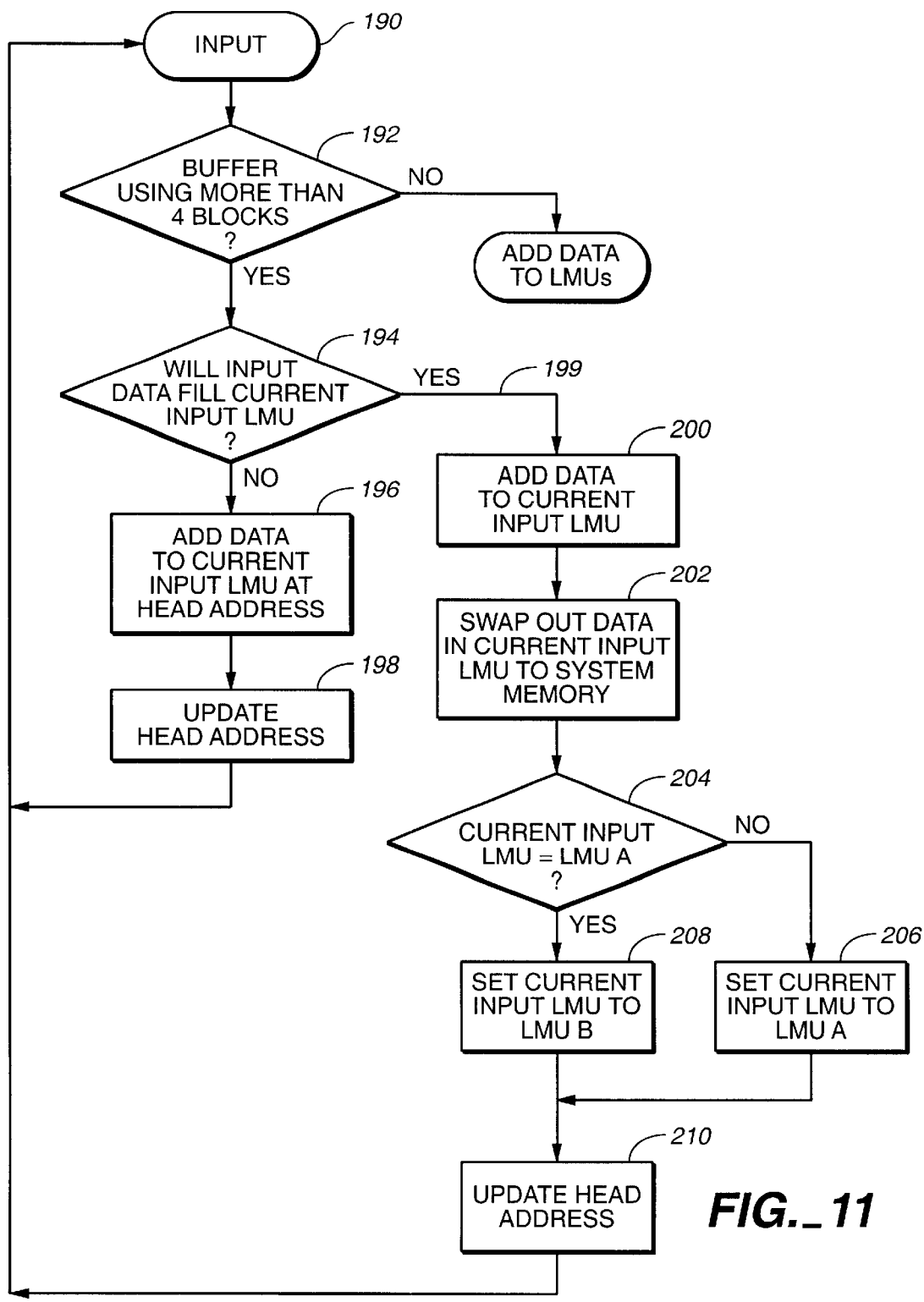
FIG._11

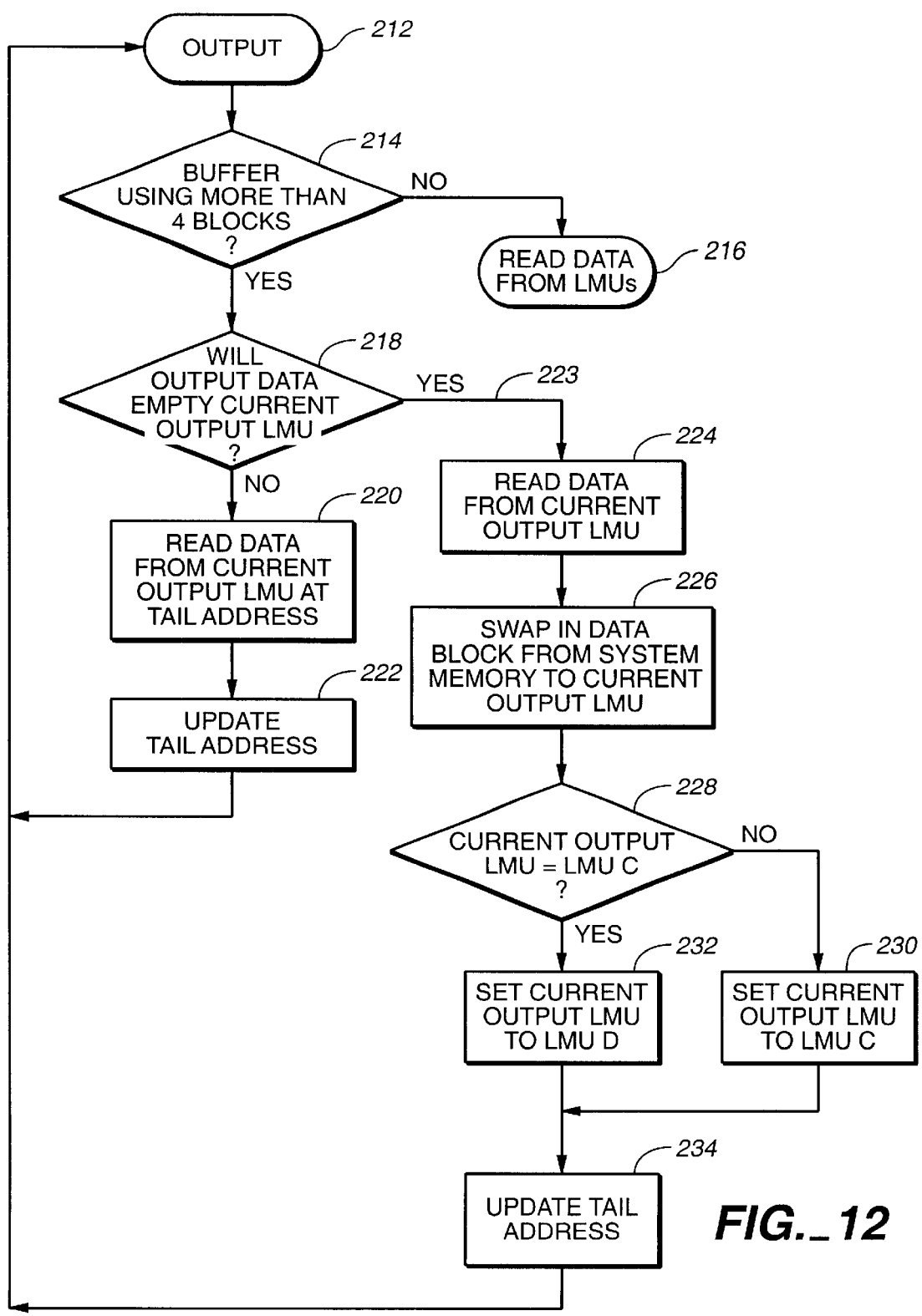
FIG._12

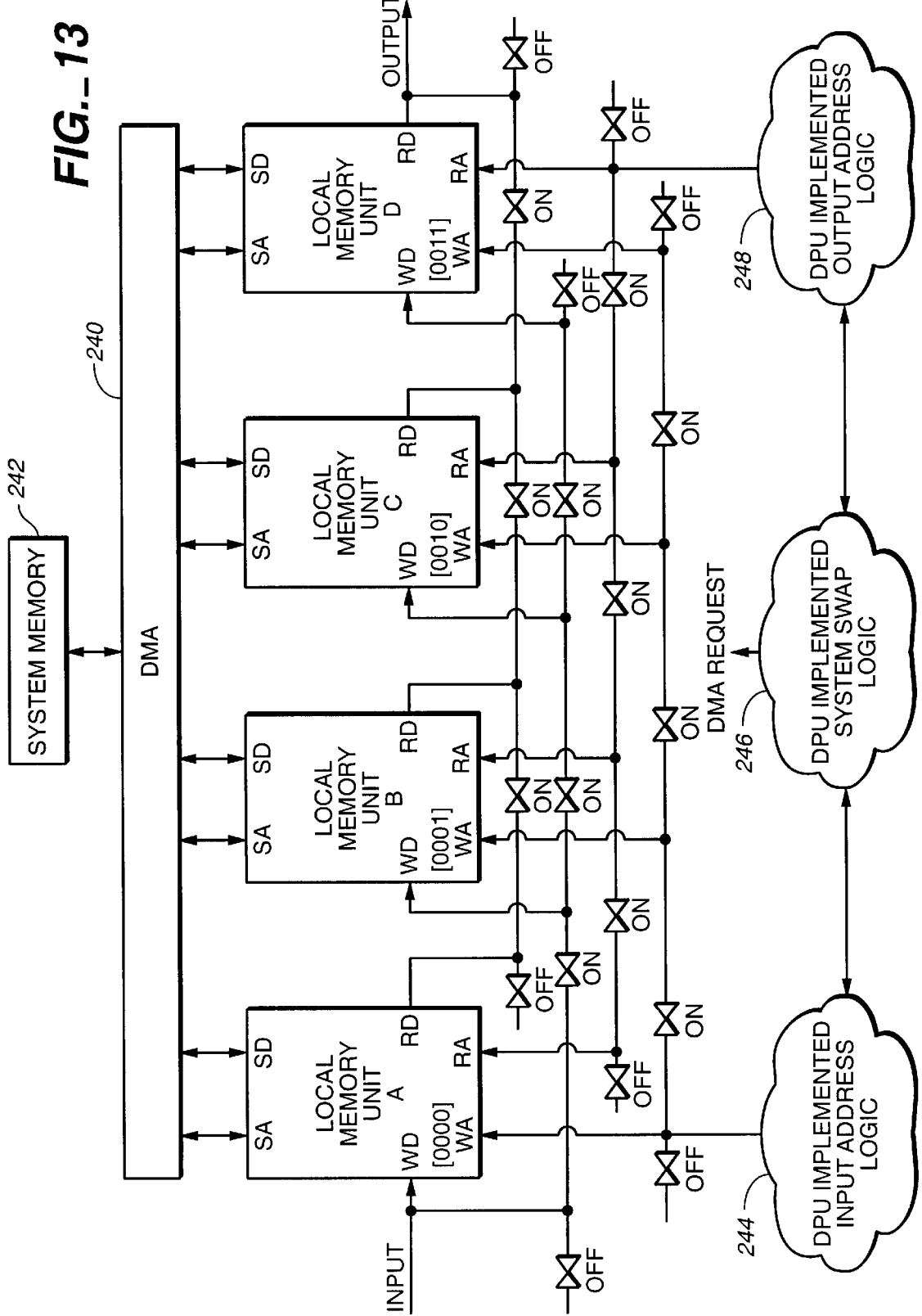
FIG._13

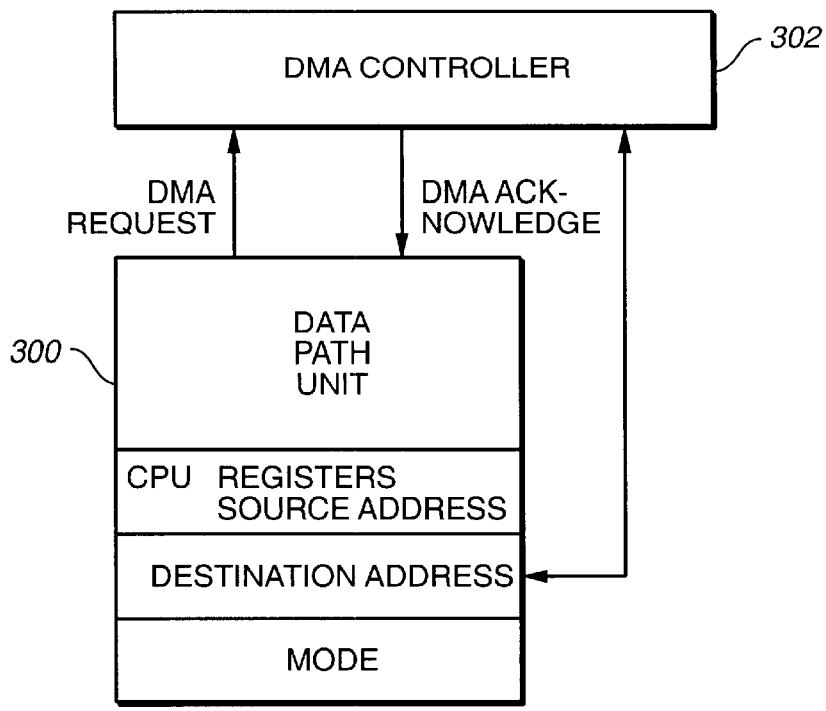
FIG._14
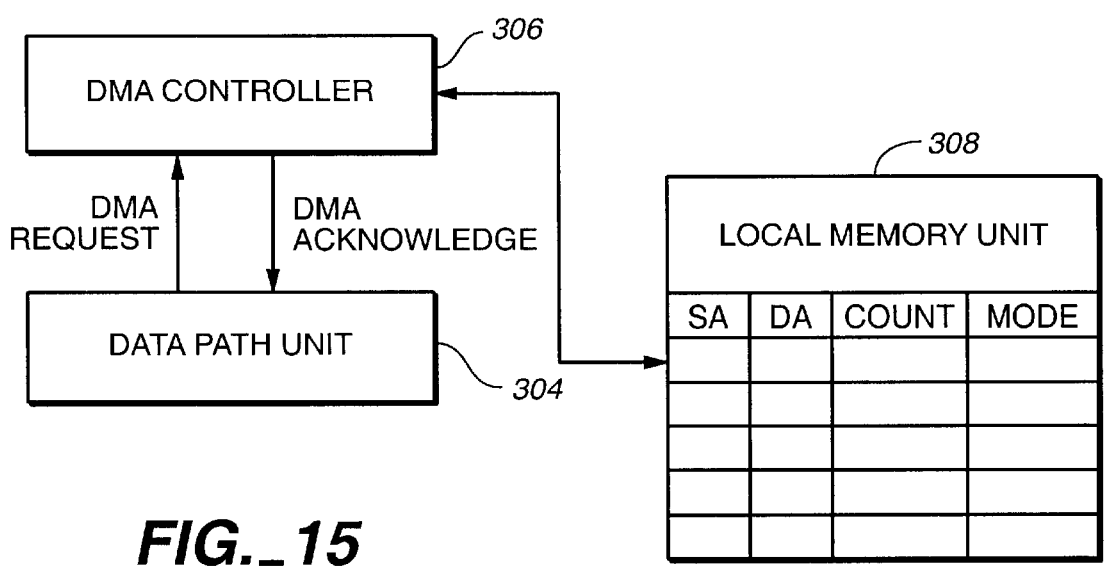
FIG._15

LOCAL MEMORY UNIT SYSTEM WITH GLOBAL ACCESS FOR USE ON RECONFIGURABLE CHIPS

CROSS REFERENCE TO RELATED APPLICATION

Application Ser. No. 09/333,977, filed Jun. 16, 1999, is incorporated herein by reference.

BACKGROUND OF THE INVENTION

The present invention relates to reconfigurable logic chips. Reconfigurable logic chips, such as field programmable gate arrays (FPGAs) have become increasingly popular. Such chips allow logic to implement different circuits at different times.

FPGAs are also being increasingly used because they offer greater flexibility and shorter development cycles than traditional Application Specific Integrated Circuits (ASICs), while providing most of the performance advantages of a dedicated hardware solution.

One growing popular use of FPGAs is referred to as reconfigurable computing. In reconfigurable computing, hardware logic functions are loaded into the FPGA as needed to implement different sections of a computationally intensive code. By using the FPGAs to do the computational intensive code, advantages are obtained over dedicated processors. Reconfigurable computing is being pursued by university researchers as well as FPGA companies.

A problem with typical FPGAs concerns memory access. One common FPGA memory layout uses a central memory. Unfortunately, accesses to this central memory can form a bottleneck. A large number of access lines are required and, even then, only a certain level of concurrent access is supported.

Other systems create memory units from reconfigurable logic. A disadvantage of these systems is that a large amount of chip "real estate" is required for the reconfigurable logic to implement a memory system. Additionally, programming the reconfigurable logic to implement the memory can be quite complicated.

It is desired to have an improved memory system for a reconfigurable chip.

SUMMARY

The present invention uses dedicated local memory units distributed throughout the reconfigurable logic. The local memory units have system bus ports which allow for quick and easy access with an external system memory. The system bus ports are in addition to local bus ports of the local memory units. The system bus ports allow for system memory transfers done by a direct memory access (DMA) controller on the reconfigurable chip.

In one embodiment, data path units on the reconfigurable chip can initiate the transfer of memory between the system memory and the local memory units. Data path units are reconfigurable elements that execute a number of functions. The initiation of the block data transfer can be the result of a data path unit instruction. The data path units can calculate when to transfer data between the system memory and the local memory units, for example, upon an overflow or underflow of a local memory unit.

In an alternate embodiment, the data path units and local memory units are associated with circuitry to do an automatic cache-like transfer of data between the local memory units and the system memory. This transfer can greatly simplify the programming of the reconfigurable chips. With the cache-like transfer of data, the programming of the reconfigurable chips can substantially ignore the small size of the local memory units. Portions of the system memory can be automatically loaded in and out of the local memory units without requiring programmed steps. This cache-like system is aided by the use of the system memory ports on the local memory units.

Another embodiment of the present invention involves implementing a memory structure using the reconfigurable chip. The implemented memory structure uses local memory units on the reconfigurable chip along with an external memory. During the operation of the memory structure, data is swapped between the local memory unit and the system memory. This swapping is made easier by the use of the system memory port on the local memory units. The implemented memory structure can be made quite large, and is not limited by the size of the local memory units on the reconfigurable chip. The swapping of data in and out of local memory units can occur concurrently with the operation of other local memory units in the implemented memory structure. In the preferred embodiment, data path units can calculate when to swap out or swap in data to and from the local memory units.

One example of an implemented memory structure is a First-In-First-Out (FIFO) buffer. The FIFO buffer is implemented using local memory units acting as a head and tail of the FIFO buffer. The middle of the implemented FIFO buffer can be stored in the system memory.

BRIEF DESCRIPTION OF THE DRAWINGS

FIG. 1 an overview of the reconfigurable chip of one embodiment of the present invention.

FIG. 2 is a diagram showing the arrangement of a slice for the reconfigurable chip of the embodiment of the present invention.

FIG. 3 is diagram which illustrates the operation of the data processing and a local memory unit block for the present invention.

FIG. 4 is an alternate embodiment of a system using the data path unit and local memory unit of the present invention.

FIG. 5 flow chart that illustrates the operation of a portion of the apparatus in FIG. 4

FIG. 6 is a diagram that illustrates the interconnection between the local memory units and the data path units.

FIG. 7 is a diagram that illustrates the interconnection between the local memory units and the system memory busses.

FIGS. 8A and 8B are illustrations that show the arrangement of the local and global address.

FIG. 9 is a diagram illustrating the interconnection between the local memory units and the system memory units in one embodiment of the present invention.

FIG. 10 is a diagram that shows a top-level view of the use of local memory units and system memory to implement a FIFO buffer.

FIGS. 11 and 12 are flow charts which illustrate the operation of the implemented FIFO buffer of FIG. 10.

FIG. 13 illustrates one method of interconnecting local memory units in order to implement a FIFO buffer.

FIGS. 14 and 15 illustrate two embodiments of the data path unit interacting with DMA controller.

DETAIL DESCRIPTION OF THE PREFERRED EMBODIMENT

FIG. 1 is a diagram which illustrates a reconfigurable chip 20 and external memory 22. The external memory 22 is connected to the memory controller 24. The address and data from the external memory is sent to the system data bus 26 and system address bus 28. These busses are interconnected to a Direct Memory Access (DMA) control/bus interface 30 connected to the local memory units. In the embodiment shown, the local memory units are arranged in slices interleaved with the data path units. Slices 32, 34, 36, and 38 are shown. Each of the slices has a configuration memory 32a, 34a, 36a, and 38a. This configuration memory is loaded from the configuration buffer 40. Also shown in this system, is the central processing unit 42 and the fabric setup and control logic 44. The configuration memory stores the arrangement of configurable logic and the interconnections between the configurable logic and the local memory units. This diagram does not show the input and output to the slices or the interconnection between the data path units of the slices. The connection to the external memory through the DMA control/bus interface 30, as will be discussed below, allows for the transferring of blocks of data between the external memory and the local memory units.

FIG. 2 illustrates one slice 50 of the reconfigurable chip of FIG. 1. The slice 50 is divided into tiles 50a, 50b, 50c, and 50d. Each of the tiles contains a number of local memory units 52, and data path units 54 and 56. Some of the data path units are adapted to generate local read/write addresses. The data path units can execute a number of functions on the reconfigurable chip.

FIG. 3 is a diagram illustrating the interconnection of a data path unit element with the local memory unit. The local memory unit is attached to the system bus 62, local read bus 64, and local write bus 66. The system bus 62 allow the local memory unit to be read from and write to a system memory independent from the local read and write accesses. Reconfigurable connections 68 on the read and write busses 64 and 66 allow the local memory units and the data path units to be interconnected together in a variety of fashions.

Reconfigurable connections on the local bus lines allow segments of the bus line to be electrically connected or isolated as desired. The reconfigurable connections can be implemented as transmission gates or pairs of directional gated buffers. Such reconfigurable connections are provided for each bit of the bus lines.

The data path unit includes an operation unit 70 that can implement a number of functions. The input data to the operation unit comes from registers 72 and 74. The output of operation unit 70 is stored into register 76. Data path units have a connection to the local memory unit 60. The operation unit 70 can provide a write address to the local memory unit, a write address to the write address portion of the write bus 66, data to the write data 68 portion of the local memory unit, or data to the write data portion of the write bus line 66. The operation unit 70 can also provide the read address to the read address portion of the local memory unit 60 or to the read address portion of the read bus 64. The read data from the local memory unit can be sent out to the read bus 64 or to the mutiplexer 78 to provide the output of the data path unit. A number of gated buffers 80, 82, 84, and 86 are used to arrange the interconnection between the operation unit and the local busses 64 and 66.

The gated buffer 88 is used to send a request on line 90 to DMA controller on the reconfigurable chip in order to send memory to local memory unit 60 or another local memory unit on the reconfigurable chip.

In one embodiment, the DMA transfer requires the source address (the local memory unit or system memory), the destination address (system memory or local memory unit), and the size of the data transfer. This information can be provided in three cycles. After this information is sent to the DMA controller, the DMA controller transfers data between the local memory unit and the system memory. The DMA transfer need not be to or from a local memory unit adjacent to the data path unit making the request; local memory units anywhere in the computing fabric can be accessed in the DMA transfer.

FIG. 14 shows another embodiment for the data unit transfer. The data path unit 300 is connected to the DMA controller 302. DMA request goes to DMA controller 302. The DMA controller then obtains the source address, destination address, count and mode from registers in the data path unit. Once the data transfer is finished the DMA controller 302 sends an acknowledge signal to the data path unit 300.

FIG. 15 shows an alternate embodiment. Data path unit 304 is connected to the DMA controller 306. When a DMA request is sent from the data path unit 304, the DMA controller 306 checks in one of the local memory units 308 to obtain the source address, data address, count and mode. In this system the mode can contain an indicator which can control the DMA controller to move on to the next group of source address, data address, count and mode without requiring the intervention of the data path unit. In this embodiment the DMA controller continues to do the data transfers to the local memory units until each of the requests in the local memory are finished. In one embodiment, each line of the local memory unit can store a source address, data address, count or mode. In this instance, four lines will store all of the information for a transfer and the local memory unit can store up to 16 groups of the transfer information.

The advantage of calculating the source address, data address, count and mode within the data path unit is that these calculations can be done in parallel. This can reduce the time required to calculate the address which can be a limiting factor in some data protocols such as the asynchronous transfer mode (ATM).

FIG. 4 illustrates an alternate embodiment that uses the cache-like controller 92. In this system, when data is stored in the local system memory from the system memory, an indication of the higher bits of the system memory address are stored in the tag memory 94. When the operation unit 70' accesses memory, the memory address is compared to the address or addresses stored in the tag memory using comparator 96. If there is a match, the system accesses the local memory unit in the normal fashion. If there is not a match, the system operations halts, and a request is sent across request line 90' to cause data from the system memory to be loaded into the local memory unit. Such an operation is similar to a cache system used with microprocessors. However, the present invention uses a large number of the local memory units distributed about the reconfigurable chip. The tag memory can store a single tag value or it can be arranged to store multiple tag values.

FIG. 5 is a flow chart illustrating the operation of the apparatus in FIG. 4. In step 100, a data path unit instruction is obtained. In step 102, the instruction is checked to see whether the data processing unit accesses data stored in the memory. If not, no further operation occurs with respect to the cache unit. If the data path unit instruction accesses the local memory, step 104 checks whether the top bits of the address match the tag memory values stored in the tag region. If these bits match, the access to the memory access is done in step 106. If not, execution is halted, data is swapped in from the system memory and the execution restarted in step 108. In step 110, after the execution is restarted, the memory access is repeated in the local memory.

FIG. 6 illustrates the local bus connections between the local memory units 120, 122, and 124, and the data path units 126, 128, and 130. Reconfigurable connections 132 are used to interconnect the local memory units. Gated buffers 134 are also used to aid in interconnection. Details of the interconnection system of local memory units are described in the patent application "A Hierarchical Distributed Memory System for Realization of Localization of Variable Requirements for an Adaptive Computing Fabric".

FIG. 7 shows one embodiment of a system interconnect between the local memory units and a system bus 140. The local memory units 142 and 144 are connected to the system bus using buffers 146 and multiplexers 148; and multiplexers 150 and buffers 152. The connection of the local memory units to the system memory is such that more than one element in the local memory unit can be loaded at a time. Such a system speeds up the switching of memory in and out to the local memory unit.

FIGS. 8A and 8B illustrate the arrangement of the local and global addresses. The local address 150 includes a Field 150*a*, contains the position within an element of a local memory unit. The element ID bits 150*b* indicate an element within the N×M local memory unit. Bits 150*c* corresponds to local memory ID bits. These bits are compared with identity bits stored in the local memory units. This allows the local memory units to be connected together as described in the patent application "A Hierarchical Distributed Memory System for Realization of Localization of Variable Requirements for an Adaptive Computing Fabric", discussed above.

The global address 152 is shown in FIG. 8B. The global address 152 includes Field 152*a* which indicates a position within the multiple element block in the global address. The block ID bits 152*b* show the block number within the local memory. The local memory ID field 150*c* can be the fixed local memory identity when used with the memory scheme of FIG. 3, or can be the tag bits which are used in the memory scheme of FIG. 4.

FIG. 9 illustrates use of the system of the present invention. The system memory 160 is connected by the system bus 162 to a local memory unit 164. This local memory unit 164 has local bus 166 connections to configured logic 168, which then is connected on local bus 170 to local memory 172. Local memory 172 is connected out of the system bus 162 to the system memory 160. FIG. 9 illustrates the use of the local memory units to act as buffers for the system memory. The system bus 162 allows quick access between the local memory units 164 and 172 and the system memory.

FIGS. 10–13 show how one memory structure, such as a FIFO buffer, can be implemented using the local memory units and the system memory. FIG. 10 is a diagram that illustrates an implemented first-in-first-out (FIFO) buffer 180. The local memory 184 has a number of local memory units which are used in the FIFO buffer. Local memory units A and B are used to store the data as it enters the FIFO buffer. The head address shows the local address of the position to write into the buffer. When the local memory unit B is filled up, the system switches to write memory into the local memory unit A. The contents of the local memory unit B is swapped out to the system memory block CII. This swapping step can be done concurrently with data being written into local memory unit A. By the time local memory unit A is filled with data, the local memory unit B will again be available to have data written into it. The local memory units, C and D contain the data to be written out of the FIFO buffer. When the local memory unit C is completely emptied of data, data is written out of the local memory unit D. Thereafter, data from the system memory block I can be swapped into the local memory unit C. The use of the system memory port in the local memory units, allows for a quick swapping in and out of data between the local memory and the system memory.

Although FIG. 10 shows an implementation of a FIFO buffer, additional memory structure implementations such as tree structures, linked lists, or large tables can also be implemented. These implemented memory structures also use local memory units and the system memory, where the reconfigurable chip causes data to be swapped in and out of the local memory units from and to the system memory.

FIGS. 11 and 12 are flow charts illustrating the operation of the FIFO buffer. Looking at FIG. 11, step 190 indicates the inputting of data to the FIFO buffer. Step 192 checks whether the FIFO buffer has more than 4 blocks of data to determine if the FIFO buffer is completely contained within the local memory units. If the buffer is not using more than 4 blocks, the data is added to the local memory units in the conventional manner in step 194. If the buffer is using more than 4 blocks, in step 194, it is checked whether the data will fill the current input unit. If not, data is added to the current input local memory unit at the head address, in step 196 and the head address is updated, in step 198. If the data will fill the current local memory unit, the data is added to the current input local memory unit in step 200. In step 202, the data in the current input local memory unit is swapped out to the system memory. Step 202 can be done concurrently with other steps at any time before the next branch 199. In step 204, data is checked whether the current input local memory unit is local memory unit A. If not, the current input local memory unit is set to a local memory unit A in step 206. If the current input local memory unit is local memory unit A, then the current input local memory is set to local memory unit B, in step 208. In step 210, the head address is updated.

FIG. 12 is a flow chart illustrating the output operation. In step 214, it is checked whether the FIFO buffer is using more than 4 blocks. If not, data is read normally from the local memory units, in step 216. Step 218 checks whether the output of data will empty the current output local memory unit. If not, data is read out of the current local memory unit at the tail address in step 220. In step 222, the tail address is updated. If the output data will empty the current local memory unit, data is read from the current local memory unit in step 224. In step 226, data is swapped-in from the system memory to the current output local memory unit. Step 226 can be done concurrently with the other steps until the next time the system goes to branch 223. The step 228 checks whether the current output local memory unit is local memory unit C. If not, in step 230, the current output local memory unit is set to local memory unit C. If the current output local memory unit is local memory unit C, the current output local memory unit is switched to local memory unit D. In step, 234, the head address is updated.

Note that the actions described in FIGS. 11 and 12 of inputting and outputting of data from the FIFO could be implemented independently in the data path units, as long as the head and tail address do not interfere with one another. This can speed the operation of the FIFO buffer. The operation of many local memory units and many data path units concurrently within the same reconfigurable chip can produce considerable computation time advantages for reconfigurable computing.

FIG. 13 illustrates one implementation of a FIFO buffer with the system of the present invention. The data and local memory units are connected using a system and data bus to a data memory access controller 240, which connects to the system memory 242. Other local connections are interconnected as shown. Thus, the write data can be sent to any of the local memory units shown. The output data from any of the units shown, and the write and read addresses are sent to all the units. When the size of the FIFO buffer is greater than the 4 memory units, local memory units A and B are used for writing data in, whereas local memory units C and D are used for writing data out of the FIFO buffer. The local memory units A, B, C, and D are given different identity bits so that the local write and read addresses can point to specific local memory units. The input address logic 244 is implemented with data path units to provide the input address. A data path unit can store the current input address and while the address is being input to the same local memory unit increment the write address after each write to the FIFO buffer. Each time, a new local memory unit is set as the current input local memory unit, the identity bits for the current input local memory unit are masked onto the write address. This can be done by data path units which implement a state machine, storing which memory unit is the current memory unit and indicating which input will cause the current input local memory to switch. Data path units can also implement the system swap logic 246. The system swap logic 246 causes data to be swapped from a full local memory unit A or B to the system memory and to be loaded to an empty local memory unit C or D from the system memory. The address logic for the output address 248 can also be implement with the data path units. As described above, the output address will decrement as data is read from the local memory unit. When a local memory unit is empty of data, the current output local memory unit is switched and the read address is masked with byte data bits for the new current output address.

Since the swap logic 246 can cause the data in the local memory units to be swapped to or from the system memory 242, the implemented FIFO buffer can be as large as the system memory. The swapping of data between the system memory and the local memory units can be done behind the scenes which allows for very fast access to the memory structure. Even though the implemented memory structure can be very large, it will operate very fast.

It will be appreciated by those of ordinary skill in the art that the invention can be implemented in other specific forms without departing from the spirit or central character thereof. The presently disclosed embodiments are therefore considered in all respects to be illustrative and not restrictive. The scope of the invention is illustrated by the appended claims rather than the foregoing description, and all changes which come within the meaning and range for equivalence thereof are intended to be embraced herein.

What is claimed is:

1. A reconfigurable chip comprising:
a number of data path units able to implement a number of functions, the data path units receiving input data and producing output data as determined by the implemented function;
a number of dedicated local memory units operably connected to data path units, the local memory units storing N elements by M bits, the local memory units including at least one global system port and at least one local port, the local port adapted for data path unit data transfers, at least one of the local memory units adapted to store data to be provided as input data to at least one of the data path units using the at least one local port; and
a global memory access means operably connected to the global system ports for interconnection to a system memory.

2. The reconfigurable chip of claim 1, wherein the data path units can initiate a data transfer between local memory units and a system memory.

3. The reconfigurable chip of claim 2, wherein the data path units use instructions and wherein
at least one of the instructions can initiate data transfer between local memory units and a system memory.

4. The reconfigurable chip of claim 1, wherein the system memory is external to the reconfigurable chip.

5. The reconfigurable chip of claim 1, wherein the global memory access means includes a bus operably connected to the global system ports.

6. The reconfigurable chip of claim 5, wherein the global memory access means further includes a direct memory access (DMA) controller connected to the bus.

7. The reconfigurable chip of claim 1, wherein the local memory units are arranged with fixed memory addresses with respect to the global memory access means.

8. The reconfigurable chip of claim 1, wherein the data path units are operably connected to a request line to initiate a data transfer between local memory units and a system memory.

9. The reconfigurable chip of claim 8, wherein the request line is connected to a direct memory access (DMA) controller.

10. The reconfigurable chip of claim 1 wherein the local memory units further include a local read port and a local write port.

11. The reconfigurable chip of claim 1, further comprising reconfigurable connections on local bus lines between local memory units, the reconfigurable connections allowing the selective connection of local memory units.

12. The reconfigurable chip of claim 1, wherein the reconfigurable chip is arranged to implement a memory structure.

13. The reconfigurable chip of claim 12, wherein the reconfigurable chip is arranged to implement a first-in-first-out (FIFO) buffer.

14. The reconfigurable chip of claim 12, wherein the data is swapped between the local memory unit and the system memory unit to implement the memory structure.

15. The reconfigurable chip of claim 1, wherein the local memory units act as cache memory units for the system memory.

16. The reconfigurable chip of claim 15, wherein associated with the local memory units are automatic memory swapping units.

17. The reconfigurable chip of claim 15, wherein the automatic memory swapping units include a tag memory and comparator.

18. The reconfigurable chip of claim 15, wherein the system uses valid bits to indicate whether data in the local memory unit is valid.

19. The reconfigurable chip of claim 1, wherein the local memory units are read and write addressable by the data path units.

20. The reconfigurable chip of claim 1, further comprising reconfigurable connections on local bus lines between data path units and local memory units to operably connect the data path units and local memory units, the reconfigurable connections allowing addresses from one of the data path units to be sent to a single local memory unit or a group of local memory units.

21. The reconfigurable chip of claim 1, wherein the data path units and local memory units are arranged into slices.

22. The reconfigurable chip of claim 1, wherein the reconfigurable chip is arranged for reconfigurable computing.

23. A reconfigurable chip comprising:
 a number of data path units able to implement a number functions, the data path units receiving input data and producing output data as determined by the implemented function; and
 a number of dedicated local memory units operably connected to data path units, the local units storing N elements by M bits, the local memory units including at least one global system port and at least one local port, the local port adapted for data path units data transfers, wherein at least one of the data path unit can initiate a data transfer between at least one of the local memory units and a system memory, the data transfer using the global system port of the at least one of the local memory units.

24. The reconfigurable chip of claim 23, wherein the data path unit can initiate a block data transfer of multiple data elements between local memory units and a system memory.

25. The reconfigurable chip of claim 23, wherein the data path units are operably connected to a request line to initiate a data transfer between local memory units and a system memory.

26. The reconfigurable chip of claim 23, wherein the data path units use instructions and wherein at least one of the instructions can initiate data transfer between local memory units and a system memory.

27. The reconfigurable chip of claim 23, wherein determination of a data transfer is the result of calculation by one of the data path units.

28. The reconfigurable chip of claim 23, wherein the local address, system address, data transfer length indications are sent to a data memory access (DMA) unit from at least one data path unit to implement the data transfer.

29. The reconfigurable chip of claim 23, wherein the data transfer is from the system memory to a local memory unit.

30. The reconfigurable chip of claim 23, further comprising a global memory access means operably connected to the global system ports for interconnection to a system memory.

31. A method of implementing a memory structure on a reconfigurable chip, the reconfigurable chip including a number of dedicated local memory units, the method comprising:
 implementing a memory structure on the reconfigurable chip, the memory structure including at least one of the local memory units, wherein the local memory units including at least one global system port;
 operating the memory structure;
 in response to the operating step, swapping data between the at least one of the local memory unit and a system memory.

32. The method of claim 31, wherein the swapping step is automatic.

33. The method of claim 31, wherein the swapping step uses a tag memory and comparator.

34. The method of claim 31, wherein the swapping step is initiated by a data path unit on the reconfigurable chip.

35. The method of claim 31, wherein some of the data of the implemented memory structure is stored in the local memory units and other data of the data of the implemented memory structure is stored in the system memory.

36. The method of claim 35, wherein the swapping step comprises moving data out of a local memory unit to the system memory when the local memory unit is full of data for the implemented memory structure.

37. The method of claim 35, wherein the swapping step comprises moving data from the system memory unit to a local memory unit the local memory unit is emptied of data for the implemented memory structure.

38. The method of claim 31, wherein the implemented memory structure is a first-in-first-out (FIFO) buffer.

39. The method of claim 31, wherein the implemented memory structure comprises tree data structure.

40. The method of claim 31, wherein the implemented memory structure comprises a table data structure.

41. A reconfigurable chip comprising:
 a number of reconfigurable units able to implement a number of computational functions, the reconfigurable units receiving input data and producing output data as determined by the implemented function;
 a number of dedicated local memory units operably connected to the reconfigurable units, the local memory units storing N elements by M bits, the local memory units including at least one global system port and at least one local port, the local port adapted for reconfigurable unit data transfers, at least one of the local memory units adapted to store data to be provided as input data to at least one of the reconfigurable units using the at least one local port; and
 a global memory access means operably connected to the global system ports for interconnection to a system memory.

42. The reconfigurable chip of claim 41, wherein the reconfigurable units are data path unit.

43. (Amended) A reconfigurable chip comprising:
 a number of reconfigurable units able to implement a number of computational functions, the reconfigurable units receiving input data and producing output data as determined by the implemented function; and
 a number of dedicated local memory units operably connected to reconfigurable units, the local memory units storing N elements by M bits, the local memory units including at least one global system port and at least one local port, the local port adapted for reconfigurable unit data transfers, wherein at least one of the reconfigurable units can initiate a data transfer between at least one of the local memory units and a system memory, the data transfer using the global system port of the at least one of the local memory units.

44. The reconfigurable chip of claim 43, wherein the reconfigurable unit is a data path unit.

* * * * *

UNITED STATES PATENT AND TRADEMARK OFFICE
CERTIFICATE OF CORRECTION

PATENT NO. : 6,347,346 B1
DATED : February 12, 2002
INVENTOR(S) : Taylor

It is certified that error appears in the above-identified patent and that said Letters Patent is hereby corrected as shown below:

Column 2,
Line 37, delete "the" before the word "embodiment" and insert -- one --.
Line 39, insert -- a -- before the word "diagram".
Line 45, insert -- is a -- before the word "flow".

Column 9,
Line 12, insert -- of -- at the end of the line.
Line 17, insert -- memory -- after the word "local".
Line 21, delete "unit" and insert -- units --.

Signed and Sealed this

Twenty-fourth Day of August, 2004

JON W. DUDAS
*Director of the United States Patent and Trademark Office*